United States Patent
Kamijo

(10) Patent No.: US 7,605,524 B2
(45) Date of Patent: Oct. 20, 2009

(54) SURFACE ACOUSTIC WAVE DEVICE AND METHOD OF MANUFACTURING THE SAME

(75) Inventor: Atsushi Kamijo, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 233 days.

(21) Appl. No.: 11/594,585

(22) Filed: Nov. 8, 2006

(65) Prior Publication Data
US 2007/0103038 A1    May 10, 2007

(30) Foreign Application Priority Data
Nov. 10, 2005  (JP) ............... 2005-325663

(51) Int. Cl.
*H01L 41/047* (2006.01)
*H01L 41/22* (2006.01)
(52) U.S. Cl. .................... 310/364; 29/25.35
(58) Field of Classification Search .............. 310/364
See application file for complete search history.

(56) References Cited

U.S. PATENT DOCUMENTS

| | | | |
|---|---|---|---|
| 5,558,711 A | 9/1996 | Sakurai | |
| 6,316,860 B1 | 11/2001 | Kimura et al. | |
| 6,407,486 B1 | 6/2002 | Kimura et al. | |
| 6,657,366 B2 | 12/2003 | Watanabe et al. | |
| 6,903,488 B2 | 6/2005 | Nakano et al. | |
| 2003/0006863 A1* | 1/2003 | Inoue | 333/193 |
| 2003/0132684 A1* | 7/2003 | Nakagawara et al. | 310/363 |
| 2005/0012435 A1 | 1/2005 | Nakano et al. | |
| 2005/0057121 A1* | 3/2005 | Nakagawara et al. | 310/328 |

FOREIGN PATENT DOCUMENTS

| | | |
|---|---|---|
| EP | 0 524 754 | 7/1992 |
| JP | 3-14308 | 1/1991 |
| JP | 3-48511 | 3/1991 |
| JP | 5-90268 | 4/1993 |
| JP | 5-183373 | 7/1993 |
| JP | 5-199062 | 8/1993 |

(Continued)

OTHER PUBLICATIONS

Epitaxially grown aluminum films with titanium intermediate layer on θrotated $Y$-$X$ LiNbO$_3$ piezoelectric single crystal substrates.

(Continued)

*Primary Examiner*—Walter Benson
*Assistant Examiner*—Derek J Rosenau
(74) *Attorney, Agent, or Firm*—Jordan and Hamburg LLP

(57) ABSTRACT

In order to provide a surface acoustic wave device provided with a pseudo-single crystal aluminum electrode film, having excellent power durability, easy to manufacture, and possible to grow with good reproducibility, a titanium buffer film 4 and an electrode film composed of an aluminum film or an aluminum alloy film are formed on a piezoelectric substrate 2 composed of lithium tantalate or lithium niobate. The electrode film 5 comprises a pseudo-single crystal film composed of two (111) domains. Each of the <111> directions of two (111) domains tilts in the range of 0 to 10 degrees to the substrate surface, and the <11-2> directions in the respective (111) domain planes are 1 to 15 degrees apart.

9 Claims, 13 Drawing Sheets

(a)

(b)

FOREIGN PATENT DOCUMENTS

| | | |
|---|---|---|
| JP | 6-006173 | 1/1994 |
| JP | 6-132777 | 5/1994 |
| JP | 7-135443 | 5/1995 |
| JP | 7-162255 | 6/1995 |
| JP | 7-170145 | 7/1995 |
| JP | 8-154030 | 6/1996 |
| JP | 8-204483 | 8/1996 |
| JP | 8-288782 | 11/1996 |
| JP | 9-135143 | 5/1997 |
| JP | 2001-94382 | 4/2001 |
| JP | 2002-135075 | 5/2002 |
| JP | 2002-368568 | 12/2002 |
| JP | 2003-101372 | 4/2003 |
| JP | 2003-188672 | 7/2003 |
| JP | 2003-258594 | 9/2003 |
| JP | 2005-39676 | 2/2005 |
| WO | WO-99/16168 | 4/1999 |
| WO | WO-00/74235 | 12/2000 |

OTHER PUBLICATIONS

High Power Durable SAW Filter with Epitaxial Aluminum Electrodes on 38.5 Rotated Y–X $LiTaO_3$ by Two-Step Process Sequence in Titanium Intermediate Layer.

* cited by examiner (a)

(b)

SURFACE ACOUSTIC WAVE DEVICE AND METHOD OF MANUFACTURING THE SAME

BACKGROUND OF THE INVENTION

1. Field of the Invention

The present invention relates to a surface acoustic wave device such as a surface acoustic wave filter and a method of manufacturing the same, especially to a surface acoustic wave device electrode.

2. Description of the Related Art

In recent years, surface acoustic wave devices having the advantages of low insertion loss and small size have been widely used as a resonator or a filter for mobile communication systems. In general, the surface acoustic wave device includes a single crystal piezoelectric substrate (piezoelectric single crystal substrate) and a comb electrode (inter digital transducer, hereinafter referred to as an IDT) formed on the piezoelectric substrate. As a material for the piezoelectric single crystal, quartz, lithium tantalate ($LiTaO_3$), or lithium niobate ($LiNbO_3$), etc. is used, and especially for an RF band filter, a 64 degrees rotated Y-cut $LiNbO_3$ having a large electromechanical coupling coefficient or a 32 degrees to 44 degrees rotated Y-cut $LiTaO_3$ having a large electromechanical coupling coefficient and a rather small frequency temperature coefficient has often been used.

Since excellent micro-machinability, small density to make the loading mass effect by electrode small, and low resistivity to make the insertion loss small, are required for material of a comb electrode in the surface acoustic wave device, aluminum or an aluminum alloy is generally used.

When operating a surface acoustic wave device, repeated stress proportional to frequencies is applied to an IDT electrode. It is known that hillocks or voids are created in the IDT by repeated application of stress causing stress-migration, and that the hillocks or voids make the filter characteristics deteriorate. In general, the more the electric power applied, and the higher the operating frequency, the resistance to stress-migration, or power durability, of the IDT electrode becomes low. Thus, an electrode material excellent in power durability is required for a surface acoustic wave filter, especially for a duplexer for cellular phones to which large power is applied at the RF band from 800 MHz to 2 GHz.

Hitherto, developing an electrode material for a surface acoustic wave device having a migration durability, the following methods have been proposed (1) addition of impurities, (2) micro-grain size, (3) multi-layering, (4) segregation, (5) development of high texture, (6) single crystal, and so on. The respective development methods will be explained hereinafter.

The first "addition of impurities" is a method of enhancing the rigidity of the electrode to improve power durability by adding a small amount of copper (Cu), silicon (Si), titanium (Ti), palladium (Pd), or the like to aluminum (Al). Though the power durability of the electrode is improved as the concentration of atoms added increases in general, there arise problems such as increase of insertion loss due to increase of resistivity, etching residue at the time of electrode processing, or the like. Accordingly, it is undesirable to add atoms in high concentration. Therefore, it is difficult to achieve sufficient power durability required for the surface acoustic wave filter for a duplexer by only adding impurities to aluminum.

The second "micro-grain size" is a technology disclosed, for instance, in Patent Document 1, and is a method of enhancing the rigidity of the electrode (similarly to addition of impurities) to improve power durability by making the average grain size of the electrode film small (in Patent Document 1, the average grain size is reduced to a value in the range from fiftieth to fifth of the size of the electrode finger). It is described that in order to make the grain size small, it is sufficient to add at least one metal selected from titanium (Ti), palladium (Pd), copper (Cu), niobium (Nb), nickel (Ni), magnesium (Mg), germanium (Ge), silicon (Si), cobalt (Co), zinc (Zn), lithium (Li), tantalum (Ta), gold (Au), silver (Ag), platinum (Pt), chromium (Cr), hafnium (Hf), zirconium (Zr), cadmium (Cd), tungsten (W) and vanadium (V) at wt % of 20 or less. However, reduction of grain size by the addition of impurities cannot avoid the increase in electrode resistance, which causes the undesirable increase of the insertion loss.

The third "multi-layering" is a method of enhancing the rigidity of an electrode film to improve power durability by laminating aluminum or aluminum alloy on a metal layer different from aluminum (Al), or by alternately laminating an aluminum layer and a metal layer other than aluminum (Al). As a typical example of the former, Patent Document 2 proposes an electrode structure which is "an aluminum alloy film laminated on a titanium buffer layer of 100 to 200 nm in thickness, in which the titanium film thickness accounts for 25 to 60% of the electrode thickness" It is described that since the texture of the aluminum alloy is lowered on the thick titanium buffer layer and the grain size becomes smaller, the stress on the Al or Al alloy film decreases, which results in improvement of the power durability. However, since the titanium buffer layer having a large resistivity occupies the large portion of the electrode, the resistance of the electrode becomes large, which is undesirable in terms of insertion loss.

Whereas, as a typical example of the latter, Patent Document 3 discloses an electrode having a laminated structure, in which respective two or more layers of aluminum layer and conductive layer X having a large elastic constant than aluminum (Al) are laminated alternately, adjusting the thickness of the aluminum layer and the X layer according to the stress load along the direction of the film thickness. However, as described in an embodiment of Patent Document 3, since the resistance of the electrode increases rapidly by performing multi-layering, it also brings about a problem in terms of insertion loss. In addition, since the etching properties of the aluminum layer and the X layer differ from each other, there is a problem of difficulty in size and shape control of the electrode cross section in the patterning process of comb electrode.

The fourth "segregation" is a method of enhancing the rigidity of an electrode film to improve power durability by segregation of metals other than aluminum (Al) in the aluminum alloy film. Patent Document 4 discloses "an aluminum) electrode formed on a TiN buffer layer or a titanium buffer layer, in which at least one kind of metal among copper (Cu), tantalum (Ta), tungsten (W) and titanium (Ti) is segregated in the film with a grain size of 100 to 1000 nm". When the electrode film is etched into a comb electrode shape, the segregated grains cannot be etched, which brings about a problem of short circuit between comb electrodes.

Patent Document 5 discloses "a multi-layered electrode including a buffer electrode film, an aluminum alloy electrode film, and an aluminum alloy electrode film containing easy-to-diffusion element on a piezoelectric substrate". The uppermost aluminum alloy electrode containing easy-to-diffusion element is made of a material including at least one selected from a group composed of copper (Cu), silver (Ag), gold (Au), nickel (Ni) and magnesium (Mg), which are easily diffused into grain boundaries in the aluminum alloy film as a main component, and the selected metal is diffused and deposited into the grain boundary of the aluminum alloy layer from the uppermost layer. Since this electrode has a structure such that the grains of the aluminum alloy, which is served as a principal electric conducting path, are surrounded by the grain boundary of the easy-diffuse metals having a high resistivity, the electric resistance of the electrode becomes high, which is undesirable in terms of insertion loss.

The fifth item of "development of high texture" refers to an electrode in which the (111) texture of aluminum or aluminum alloy is enhanced, as disclosed, for instance, in Patent Document 6. In a thin layer having a high (111) texture, though the <111> axes of the respective crystal grains are arranged almost uniformly in the normal direction of the substrate, their in-plane directions are dispersed randomly. Such a film in which only particular crystal axes thereof are arranged uniformly in the normal direction of the substrate, is called a uniaxial texture film. Though the diffusion routes of aluminum atoms or vacancies moving by stress-migration are mainly along grain boundaries, since the in-plane is covered by grains having (111) planes in the (111) texture film, the in-plane shows a honeycombed grain boundary structure, and the grain boundary takes a net structure formed by almost triple points. In such a case, the flux of the aluminum atoms or vacancies diffusing along the grain boundaries is easily balanced. This is considered to be the reason why the power durability is remarkably improved, compared with a polycrystal film in which principle directions are completely random, or a low texture film.

Patent Document 6 discloses that use of a metal buffer film having 1 to 50 nm in thickness, selected from vanadium (V), iron (Fe), cobalt (Co), nickel (Ni), copper (Cu), yttrium (Y) and chromium (Cr) can form an aluminum or aluminum alloy film strongly textured in the (111) direction. Patent Document 7 discloses that an aluminum or aluminum alloy film also strongly textured in the (111) direction is formed on a buffer film selected from boron (B), carbon (C), silicon (Si), germanium (Ge), SiC, BN and SiN. Furthermore, Patent Document 8 discloses that an aluminum or aluminum alloy film strongly textured in the (111) direction can be formed on a metal buffer film having the thickness of 50 nm or less, selected from tantalum (Ta), niobium (Nb), titanium (Ti), tungsten (W), molybdenum (Mo), nickel (Ni), hafnium (Hf) and scandium (Sc). It is described to be important that the buffer film is in an amorphous state.

Patent Document 9 discloses that a (111) high texture aluminum film can be formed by using a multi-layered structure composed of aluminum (Al) and a metal other than aluminum (Al) as a buffer film. Since the electrode resistance of a uniaxial high textured electrode film is less likely to get high compared with other methods described above (unless a metal possible to easily diffuse into aluminum (Al) is used for a buffer film), the possibility to increase the insertion loss is small. However, when considering recent circumstances requiring downsizing of a surface acoustic wave filter for a duplexer, development of an electrode material showing a higher power durability than that of the uniaxial high texture electrode is needed.

The sixth "single crystal" is a method to grow a film such that a specific crystal direction in a specific lattice plane of the piezoelectric substrate matches with a specific crystal direction of a specific lattice plane of the aluminum electrode (this is called an epitaxial growth). Since the crystal directions of the respective grains of the aluminum or aluminum alloy are arranged in a fixed direction almost uniformly, not only in those planes along the normal direction of the substrate, but also in the in-plane, it takes a state of no lattice boundaries, or a state in which grain boundary diffusion is restrained. Therefore, aluminum atoms or vacancies are to diffuse in a so-called lattice diffusion mode. The diffusion speed is extremely low in the lattice diffusion mode compared with that in the boundary diffusion mode. It is said that this is the reason why the power durability of a single crystal film can be more improved than that of the uniaxial high texture film.

Various methods to grow a single crystal aluminum (or aluminum alloy) film have been disclosed for the case of using quartz as a piezoelectric substrate. For instance, Patent Documents 10 and 11 disclose an aluminum (311) epitaxial film on a 25 degree rotated Y-cut quartz, and Patent Documents 12 to 14 disclose an aluminum (111) epitaxial film on a 4 to 30 degree rotated Z-cut quartz.

Materials on which an epitaxial aluminum film is obtained by the conventional methods described in Patent Documents 10 to 14 are practically limited to only a quartz substrate. A piezoelectric substrate used for an RF band surface acoustic wave filter which requires excellent power durability is $LiNbO_3$ or $LiTaO_3$. The followings are well known methods to grow a single crystal or an epitaxial aluminum film on those piezoelectric substrates.

Patent Documents 15 and 16 are conventional methods to directly grow single crystal aluminum (Al) on piezoelectric substrates made of $LiNbO_3$ or $LiTaO_3$. The epitaxially grown aluminum (111) film on a 36 degree rotated Y-cut $LiTaO_3$ is disclosed in the former, and the aluminum (111) film grown epitaxially on 32 to 68 degree rotated Y-cut $LiTaO_3$ and $LiNbO_3$ substrates is disclosed in the latter. There is a description that an epitaxial aluminum film can grow on $LiTaO_3$, $LibO_3$, or $Li_2B_4O_7$ substrates, as well as on a quartz substrate, but nothing is mentioned on what plane and in what plane direction the aluminum film epitaxially grows.

Patent Document 17 discloses a method of manufacturing an epitaxial aluminum film "by growing the film while irradiating ion beams having an ion current density of 0.01 to 10 $mA/cm^2$ with ion energy of 200 to 1000 V". However, the difficulty of directly forming single crystal aluminum (Al) on a substrate, and the extremely low production yield are problems existing in this method. This is caused by a condition that the original lattice plane of the piezoelectric substrate is covered by a processed surface layer having a disordered crystal structure created by a polishing process on the substrate surface. In order to remove the influence of the surface layer having the disordered crystal structure of the substrate surface, Patent Document 18 discloses a method to grow a single crystal aluminum (Al), "by uniformly fabricating a microscopic hemispherical island structure on the substrate surface", by means of wet etching or dry etching using fluorine related gas, though no description is made on its direction of growth. Patent Document 19 discloses a method of "growing a single crystal aluminum film after removing the substrate surface processed layer by means of ion beam etching by arranging an ion source so that the direction of the irradiating ion beams is within ±20° from a position parallel or perpendicular to the axial direction perpendicular to a lattice plane having a low index plane closest to the surface of a $LiTaO_3$ substrate, or a $LiNbO_3$ substrate".

This kind of substrate preprocessing has problems of not only an increase in the number of manufacturing processes, but also the difficulty of stable growth of a single crystal aluminum film owing to fluctuations of the preprocessing or the like. Therefore, it is not likely to be easy to directly grow the single crystal aluminum film on a $LiTaO_3$ substrate or a $LiNbO_3$ substrate. Accordingly, a method to grow a single crystal aluminum film via some buffer layer, not to directly grow the single crystal aluminum film on the $LiTaO_3$ or $LiNbO_3$ substrates, has been proposed. Insertion of a buffer layer gives the merit of enabling the growth of a single crystal aluminum film on a substrate with increased stability, compared with the case of directly growing the single crystal aluminum film on the substrate, because it relaxes lattice mismatching between the substrate crystal plane and the epitaxially growing aluminum plane. Therefore, it can be said to be preferable to use a buffer layer in terms of production yield.

Patent Document 20 discloses that it is possible to grow a (110) single crystal aluminum film by growing aluminum (Al) on a 64 degree rotated Y-cut $LiNbO_3$ substrate via a titanium buffer layer. It is described that there is an epitaxial relation such that the normal directions of a titanium (001) plane and an aluminum (110) plane are coincided with the direction perpendicular to the substrate, and both of the titanium (Ti) and aluminum (Al) are single crystal films displaying only spots in a selected-area electron diffraction. Patent Document 21 describes that when a titanium buffer layer is used on a 38 to 44 degree rotated Y cut $LiTO_3$ substrate, a (112) single crystal aluminum film grows in an epitaxial relation so that the normal direction of the aluminum (112) plane coincides with the perpendicular direction of the substrate surface.

Patent Document 22 discloses that when TiN is used as a buffer layer on a 33±9 degree rotated Y-cut $LiTaO_3$ and $LiNbO_3$ substrates, a (311) single crystal aluminum film can be grown in a tilting state by 9±9 degree to the substrate surface, and when a structure composed of two layers of TiN/Ti (on a substrate) is taken as a buffer layer, a (111) single crystal aluminum film can be grown in a tilting state by 9±9 degrees to the substrate surface.

These single crystals or epitaxial aluminum films are single crystals in which an aluminum specific crystal plane grows in parallel or in a tilting state by 9±9 degrees to a $LiTaO_3$ substrate surface or a $LiNbO_3$ substrate surface as described in Patent Document 20 (110), in Patent Document 21 (112) and in Patent Document 22 (311 or 111).

Whereas non-Patent Document 1 discloses that aluminum (111) performs twin growth on a 63 to 70 degree Y-cut $LiNbO_3$ substrate via a titanium buffer layer. It is reported from an analysis using a pole figure that an aluminum (111) plane performs twin growth in parallel to a (001) plane (also referred to as a Z plane) of $LiNbO_3$, irrespective of Y-cut angles. That the aluminum (111) plane is in parallel with the $LiNbO_3$ (001) plane, means that the direction of aluminum <111> tilts to a lithium niobate substrate surface by (90—Y-cut angles)°. The twin growth is a stacking fault, and indicates a state in which two crystals are in a mirror symmetry as for a specific lattice plane. In other words, a (111) twin crystal aluminum film is not a complete (uni-) single crystal layer, but is a pseudo-single crystal layer which consists of a mixture of two kinds, that is, one aluminum (111) single crystal grain (domain), and the other aluminum (111) single crystal grain (domain) which is formed by rotating the former by 180° in the in-plane. The (111) twin crystal growth is characterized by that a pole figure depicted by plotting (100) poles takes a six-time symmetrical pattern as shown in FIG. 1 or FIG. 3 in non-Patent Document 1.

Patent Document 23 discloses "an electrode having a twin structure in which a diffraction pattern observed in a pole figure has a plurality of (111) centers of symmetry". It is described that in order to realize such a twin structure having a plurality of centers of symmetry, provision of a process to perform wet-etching on 36 to 42 degree rotated Y-cut $LiTaO_3$ or $LiNbO_3$ substrates, and provision of a titanium or chromium buffer layer are essential. The inventors report in Patent Document 23 the analysis of growth direction of an aluminum film having the thickness of 150 nm by measuring a pole figure in non-Patent Document 2. The aluminum film is deposited at the lowered substrate temperature to room temperature, after depositing a titanium buffer to the thickness of 10 nm at the substrate temperature of 180° C. on a 38.5 degree rotated Y-cut $LiTaO_3$ substrate. According to this report, it is described that aluminum (111) grows in a twin crystal state in parallel to a (001) plane of $LiTaO_3$, similarly to the twin growth of aluminum (111) on the $LiNbO_3$ substrate in the above-described non-Patent Document 1. Therefore, it is natural to consider that "the aluminum (111) twin crystal having a plurality of centers of symmetry" also grows in parallel to the (111) plane of $LiTaO_3$.

That is, the domain (111) a of the aluminum film obtained in Patent Document 23 grows in the direction of (90–38.5)° to the normal Z1 of the piezoelectric substrate b, or in a direction deviated by 51.5° from the normal Z1 as shown in FIG. 14, and it can be said that two domains (111) being in mirror symmetry are mixed in the domain (111) group vertically growing in the figure.

In order to form an aluminum electrode having the (111) twin structure having a plurality of centers of symmetry, as described in Patent Document 23, before forming a buffer electrode layer, etching to expose a lattice plane on the piezoelectric substrate surface is needed with at least one kind of etchant selected from the group composed of phosphoric acid, pyrophosphoric acid, benzoic acid, octanoic acid, hydrochloric acid, nitric acid, sulfuric acid, hydrofluoric acid, buffer hydrofluoric acid, and potassium acid sulfate. Preprocessing by wet etching causes a problem of poor yield due to a difficulty to control the substrate surface conditions with good reproducibility. It is undesirable in terms of resultant increases in the manufacture process.

Patent Document 1: Japanese Patent Application Laid-open No. Hei 6-6173
Patent Document 2: Japanese Patent Application Laid-open No. 2002-368568
Patent Document 3: Japanese Patent Application Laid-open No. Hei 9-135143
Patent Document 4: Japanese Patent Application Laid-open No. 2005-39676
Patent Document 5: Japanese Patent Application Laid-open No. 2002-135075
Patent Document 6: Japanese Patent Application Laid-open No. Hei 5-90268
Patent Document 7: Japanese Patent Application Laid-open No. Hei 7-135443
Patent Document 8: Japanese Patent Application Laid-open No. 2001-94382
Patent Document 9: Japanese Patent Application Laid-open No. 2003-188672
Patent Document 10: Japanese Patent Application Laid-open No. Hei 3-14308
Patent Document 11: Japanese Patent Application Laid-open No. Hei 3-48511
Patent Document 12: Japanese Patent Application Laid-open No. Hei 6-132777
Patent Document 13: Japanese Patent Application Laid-open No. Hei 7-170145
Patent Document 14: Japanese Patent Application Laid-open No. Hei 8-28272
Patent Document 15: Japanese Patent Application Laid-open No. Hei 5-183373
Patent Document 16: Japanese Patent Application Laid-open No. Hei 8-154030
Patent Document 17: Japanese Patent Application Laid-open No. Hei 7-162255
Patent Document 18: Japanese Patent Application Laid-open No. Hei 5-199062

Patent Document 19: Japanese Patent Application Laid-open No. Hei 8-204483

Patent Document 20: Domestic Re-Publication of PCT International Publication for Patent Application WO99/16168

Patent Document 21: Domestic Re-Publication of PCT International Publication for Patent Application WO00/74235

Patent Document 22: Japanese Patent Application Laid-open No. 2003-101372

Patent Document 23: Japanese Patent Application Laid-open No. 2003-258594

Non Patent Document 1: O. Nakagawara et al., Crystal Growth 249 (2003), pp 497-501

Non Patent Document 2: O. Nakagawara et al., Proc. 2003 IEEE Ultrasonics Symposium, pp 1734 to pp 1737

Electrode materials having low resistivity and power durability are needed for a surface acoustic wave filter used for a duplexer for 800 MHz to 2 GHz RF band. For this usage, a single crystal aluminum film which is excellent in stress-migration resistance is considered to be most promising. However, since the surface of a 64 degree rotated Y-cut $LiNbO_3$ substrate or a 32 degree to 44 degree rotated Y-cut $LiTaO_3$ substrate is not coincident with a low index lattice plane indispensable for epitaxial growth, it is not easy to realize the epitaxial growth of a single crystal aluminum film on such a piezoelectric substrate. As described in [Background of the Invention], it is understood that it is difficult to grow the single crystal aluminum film on a $LiTaO_3$ or $LiNbO_3$ substrate with good reproducibility even if preprocessing of a substrate or introduction of a buffer layer are conducted, because single crystal aluminum films having various epitaxial growth directions are obtained even on the same substrate.

SUMMARY OF THE INVENTION

The objects of the present invention is to provide a surface acoustic wave device provided with a pseudo-single crystal aluminum electrode film which is excellent in power durability, easily manufactured and can be grown with good reproducibility, and a method of manufacturing thereof.

In order to achieve the above-described objects, the present inventors have studied the conditions to epitaxially grow single crystal aluminum on a $LiTaO_3$ substrate and a $LiNbO_3$ substrate with good reproducibility. In particular, the inventors have studied the relation between processing conditions of the substrate preprocessing of the piezoelectric substrate, Y-cut angles of the piezoelectric substrate, the film thickness of a titanium buffer film, and changes of the growth mode of obtained aluminum films. As a result, it was found that the preprocessing of substrates by wet etching or the like, which had been regarded indispensable for the epitaxial growth of the single crystal aluminum film, was unexpectedly not necessarily preferable, in terms of reproducibility. The preprocessing of substrates by wet etching or the like is originally a process to remove a surface deteriorated layer having a disordered crystal structure, which exists on the piezoelectric substrate surface due to polishing or the like so as to expose lattice planes on the piezoelectric substrate surface to create epitaxially growing templates. However, in a lithium tantalate ($LiTaO_3$) substrate or a lithium niobate ($LiNbO_3$) substrate used for an RF band surface acoustic wave device, lattice planes of not only low index ones expressed by a low index, but also high index ones expressed by a higher index exist together in the lattice planes exposed as above. Accordingly, there appears a state in which not only a single crystal aluminum film growing on the low index plane, but also a single crystal aluminum film growing on the high index plane exist together. The high index plane transforms variously according to the wet etching conditions as well as the cut angles of the piezoelectric substrate used. Therefore, it is considered to be difficult to grow a single crystal aluminum film with good reproducibility.

Then, the present inventors studied a growth process of an aluminum film growing on a titanium buffer film, using a piezoelectric substrate to which only a cleaning process by, for instance, ultrasonic cleaning to wash off a stain on the substrate surface is given while a substrate preprocessing process by wet etching or the like of the piezoelectric substrate is omitted, and the thickness of the titanium buffer film is varied. As a result, the present inventors have discovered a growth mode existing in a form never reported before, and appearing with good reproducibility, which leads to accomplishment of the present invention. The aluminum film manufactured according to this new growth mode is a so-called pseudo-single crystal aluminum film composed of two (111) domains, not a single crystal film having a single growth direction, nor a twin structured film having a plurality of centers of symmetry. The pseudo-single crystal aluminum film has the following characteristics.

The present invention is a surface acoustic wave device including a single crystal piezoelectric substrate composed of lithium tantalate ($LiTaO_3$) or lithium niobate ($LiNbO_3$), and an electrode formed on the piezoelectric substrate, in which the electrode includes a first film formed of titanium (Ti), and a second film formed of aluminum or aluminum alloy made by adding a small amount of metal atom to aluminum (Al), in which the second film is formed of a crystal film including two (111) domains growing in different directions from each other, in which both <111> directions of the two (111) domains tilt at angles within 0 to 10 degrees to the surface of the piezoelectric substrate, and in which <11-2> directions in an in-plane of each of the (111) domains are arranged uniformly, while the <11-2> direction in the in-plane of one (111) domain and the <11-2> direction in the in-plane of the other (111) domain are 1 to 15 degrees apart from each other.

As a concrete embodiment of the present invention, a structure in which the <11-2> direction of at least one (111) domain out of the two (111) domains is almost parallel to the X-axis direction in the in-plane of the piezoelectric substrate, or a structure in which the two (111) domains are nearly in mirror symmetry to the X-axis in the in-plane of the piezoelectric substrate, can be cited. Furthermore, the above-described piezoelectric substrate is a 36 to 50 rotated Y-cut lithium tantalate substrate. The thickness of the titanium buffer film is preferably 5 nm to 100 nm, and is more preferably 5 nm to 20 nm.

Another invention is a method of manufacturing a surface acoustic wave device which includes a single crystal piezoelectric substrate composed of lithium tantalate ($LiTaO_3$) or lithium niobate ($LiNbO_3$); and an electrode formed on the piezoelectric substrate, in which the electrode includes a first film formed of titanium (Ti), and a second film formed of aluminum or aluminum alloy made by adding a small amount of metal atom to aluminum (Al), in which the second film is formed of a crystal film including two (111) domains growing in different directions from each other, in which both <111> directions of the two (111) domains tilt at angles within 0 to 10 degrees to the surface of the piezoelectric substrate, and in which directions in an in-plane of each of the (111) domains are arranged uniformly, while the <11-2> direction in the in-plane of one (111) domain and the <11-2> direction in the in-plane of the other (111) domain are 1 to 15 degrees apart from each other, the manufacturing method including the steps of:

cleaning the surface of the piezoelectric substrate;

forming the first film on the piezoelectric substrate; and forming the second film on the first film, in which the cleaning process is to clean the surface of the piezoelectric substrate by applying ultrasonic waves to organic solvent in a state that the organic solvent is in contact with the surface of the piezoelectric substrate, without performing wet etching.

According to the present invention, since an aluminum electrode layer or an aluminum alloy electrode layer formed on a piezoelectric substrate is a pseudo-single crystal composed of two (111) domains, of which displacement of the azimuth angle is within 15°, it shows excellent power durability. Since the electrode of the present invention does not require preprocessing of the substrates such as wet etching or the like for removal of a deteriorated layer created by processing the disordered crystal structure of the substrate surface, the electrode can be manufactured easily, and since a pseudo-single crystal aluminum electrode film in which two (111) single crystal domains grow separately can be grown with good reproducibility, the surface acoustic wave device excellent in power durability can be manufactured at low costs with a high production yield.

DETAILED DESCRIPTION OF THE PREFERRED EMBODIMENT(S)

In order to make the above described object, characteristics and merits of the present invention clear, the present invention will be explained using the attached drawings.

Figure 1:
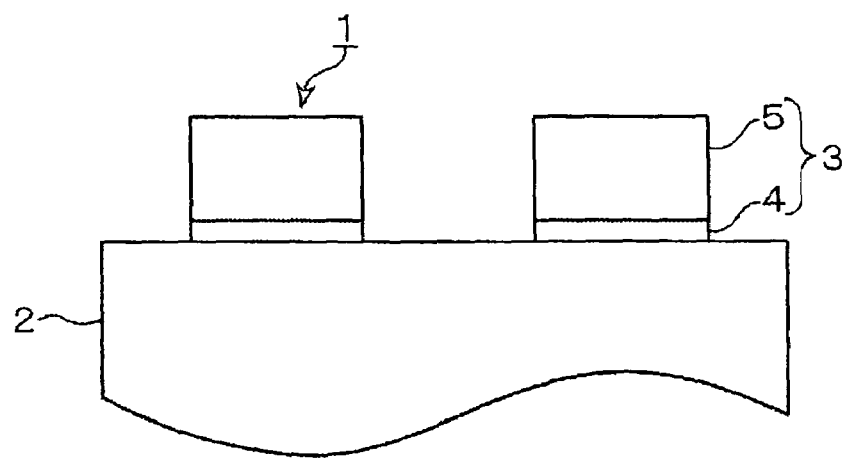
FIG. 1 is a view showing a basic structure of a surface acoustic wave device in an embodiment of the present invention.

FIG. 1 is a sectional view showing a portion of a surface acoustic wave device according to an embodiment of the present invention. An electrode 3 is formed on a piezoelectric substrate 2. The piezoelectric substrate 2 is either LiTaO$_3$ or LiNbO$_3$. More preferably, it is 36 to 50 degree rotated Y-cut LiTaO$_3$ or LiNbO$_3$ substrate. However, when it is used as a surface acoustic wave device for an RF band, the 36 to 50 degree rotated Y-cut LiTaO$_3$ is more preferable. The electrode 3 is provided with a titanium buffer film (first film) 4 formed on the piezoelectric substrate 2, and an electrode film (second electrode film) 5 formed thereon, composed of an aluminum film or aluminum series alloy film which is made by adding a small amount of metal atoms such as copper (Cu) or magnesium (Mg) to aluminum (Al). The amount of addition described in the phrase "to add a small amount of metal atoms such as copper (Cu) or magnesium (Mg)" is less than the amount with which the electrical resistance of the electrode gets too high for practical usage. It is, for instance, from about 0.1 to about 5% to aluminum (Al) by weight percentage. Though not shown in FIG. 1, an electrically insulating thin film may be formed to cover the top and side surfaces of the electrode 3.

Such a surface acoustic wave device 1 is manufactured through a film forming process to form a laminated film by stacking the titanium buffer film 4 and aluminum or aluminum alloy film 5 one by one on the piezoelectric substrate 2 using a sputtering apparatus or the like, a photolithography process to print a comb-electrode shaped resist pattern on the laminated film by resist coating, exposure and development, and an etching process to process the laminated film into the comb electrode shape while masking the resist pattern with a dry etching apparatus or the like.

The electrode film 5 made from aluminum or aluminum alloy includes a pseudo-single crystal film composed of two (111) domains. Both of <111> directions of the two (111) domains are within the range of 0 to 10 degrees to the substrate surface of the piezoelectric substrate 3, and <11-2> directions in the in-planes of the (111) domain are 1 to 15 degrees apart from each other.

Figure 2:
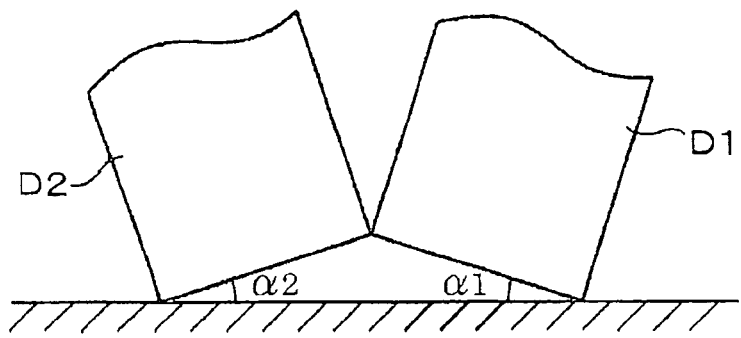
FIGS. 2A and 2B are explanatory views showing images of two (111) domains composing an electrode used in the present invention.
Figure 2:
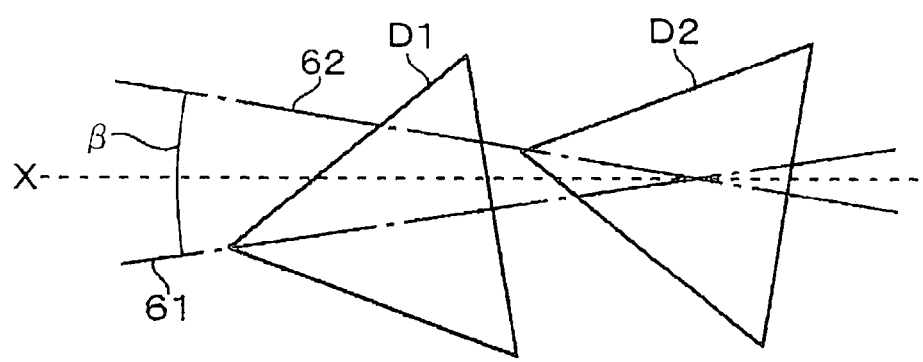

FIGS. 2A and 2B are schematic diagrams showing a texture relation between two domains (111) D1 and D2. As shown in a side view in FIG. 2A, both of the respective angles α1 and α2, between the directions of growth of these domains (111) D1, D2 and the piezoelectric substrate 2, are 0 to 10 degrees. In a plan view shown in FIG. 2B, the numerals 61 and 62 show crystal axes corresponding to the in-plane <11-2> directions of the respective two domains (111) D1, D2, and the <11-2> directions are arranged uniformly in the in-plane of the respective (111) domains. In other words, the directions of the crystal axes 61 are arranged uniformly in any portions at various heights in one domain (111) D1, and the directions of the crystal axes 62 are arranged uniformly in any portions at various heights in the other domain (111) D2. The angle β between these crystal axes 61 and 62 is in the range from 1 to 15 degrees.

In an embodiment of the present invention, the direction <−1-12> of at least one (111) domain out of the above-described two (111) domains in the electrode film 5, is almost parallel to the direction of X axis in the piezoelectric substrate surface.

In another embodiment, the above-described two (111) domains in the electrode film 5, are arranged almost in a mirror symmetry to the X axis in the piezoelectric substrate surface.

Though composed of two (111) domains, an aluminum or aluminum alloy film of the present invention is a pseudo-single crystal, in which a tilt angle of <111> crystal axis being a perpendicular direction to the (111) plane is within the range of 0 to 10 degrees from the normal direction of the substrate, and furthermore, the <11-2> direction in the in-plane of the respective (111) domains are almost parallel to the in-plane of the substrate, with the angle of 1 to 15 degrees between the respective (111) domains, and (A) the direction <−1-12> of at least one (111) domain out of two (111) domains is almost parallel to the X axis direction in the in-plane of the piezoelectric substrate, or (B) the two (111) domains are arranged so as to be almost in a mirror symmetry to the X axis in the in-plane of the piezoelectric substrate. In other words, it means in this case that the two (111) domains are in symmetry to the X axis in the in-plane of the piezoelectric substrate.

The details of the reason why it takes either any one out of these two forms A or B are not clear, it is considered that two forms A and B appear due to difference in surface conditions created by a polishing process or the like of the substrate. However, the present invention is not limited to these forms.

Though it is not a single domain, the reason for defining it to be a pseudo-single crystal film, is that the (111) planes which are the growth planes of the two domains are nearly parallel to the piezoelectric substrate surface and almost parallel to the X-axis in the piezoelectric substrate plane so that a specific directional relation, or an epitaxial relation, can be observed between the piezoelectric substrate and the aluminum film. In other words, it can be observed that two single crystal domains grow separately.

A pseudo-single crystal film composed of the above-described two (111) domains can be obtained with good reproducibility so far as the thickness of a titanium buffer film is 5 nm or more. When it is less than 5 nm, the film becomes a uniaxial texture film. When the titanium buffer film is extremely thin or is not provided, it is impossible to obtain a texture film, as well as a single crystal film. On the other hand, though the pseudo-single crystal structure composed of two (111) domains would not change by increasing the thickness of a titanium buffer film, it is undesirable to make the film thickness greater than required because it results in the increase in electrode resistance. Accordingly, when it is used for an electrode of a surface acoustic wave device, it is sufficient for the titanium thickness to be in the range of 5 to 10 nm.

When stress-migration appears, there are two diffusion routes as a diffusion path of aluminum atom or a vacancy. One is a grain boundary which is the boundary between grains, and the other is inside the grain. It is already described in the (BACK GROUND OF THE INVENTION) that since the diffusion velocity through the former path is several orders faster than that through the latter path, it is effective for improvement of power durability to get rid of or reduce the grain boundary. The pseudo-single crystal film of the present invention is composed of two (111) domains. However, as described above, since the displacement angle between the crystal axes of the in-planes of the two domains is no more than 15 degrees, the tilt angle of the two grains sandwiching the grain boundary is also 15 degrees at most. Therefore, the pseudo-single crystal aluminum film of the present invention is to have a grain boundary structure composed of a so-called small tilt angle grain boundary. Meanwhile, in the aluminum film of a twin structure having a plurality of (111) centers of symmetry disclosed in Patent Document 23, non-Patent Documents 1 or 2, a tilt angle of crystal grains to a pair of twin structures is 180 degrees, and if plural pairs of twin crystals exist without any correlation between them in addition to that, the structure of the above-described aluminum film becomes close to a grain boundary structure of a so-called (111) uniaxial high texture film. Accordingly, as for the stress-migration resistance or power durability of the surface acoustic wave device electrode, a single crystal structure (composed of a single domain) and a pseudo-single crystal composed of two (111) domains of the present invention are nearly the same level, and a twin crystal structure having a plurality of (111) centers of symmetry and a uniaxial high texture are nearly the same level with each other, but their stress-migration resistance are smaller than the above-described single crystal structure.

EMBODIMENTS

Before explaining a concrete embodiment of the present invention, an X-ray pole figure will be explained first, which is indispensable to analyze and understand a texture structure of an aluminum film or an aluminum alloy film grown on a piezoelectric substrate.

As described above, in the piezoelectric substrate of the surface acoustic wave device, used for a filter or the like for an RF band, it is rare for the substrate surface to be coincident with the low index plane of the piezoelectric crystal, like a 64 degree rotated Y-cut $LiNbO_3$ or 32 to 44 degree rotated Y-cut $LiTaO_3$, and generally, the low index plane of the piezoelectric crystal tilts greatly to the substrate surface. When the state of aluminum (Al) epitaxially grown on such a tilted plane is tried to measure (2 θ/θ scan) with an ordinary X-ray diffractometer, since the grown surface of aluminum (Al) tilts from the substrate surface, a peak does not come to appear at all. In Patent Documents 12, 13, 14, and 18, a single crystal aluminum is considered to have grown from just the result that the peak is not observed with the X-ray diffraction. However, this discussion is not accurate, and even when a crystal in question grows on a tilted plane in a uniaxial texture with the substrate surface, a peak may not be observed. Accordingly, in order to determine whether the epitaxial growth occurs on a lattice plane tilted to the substrate surface, a pole figure measurement which will be explained below needs to be conducted.

Figure 3:
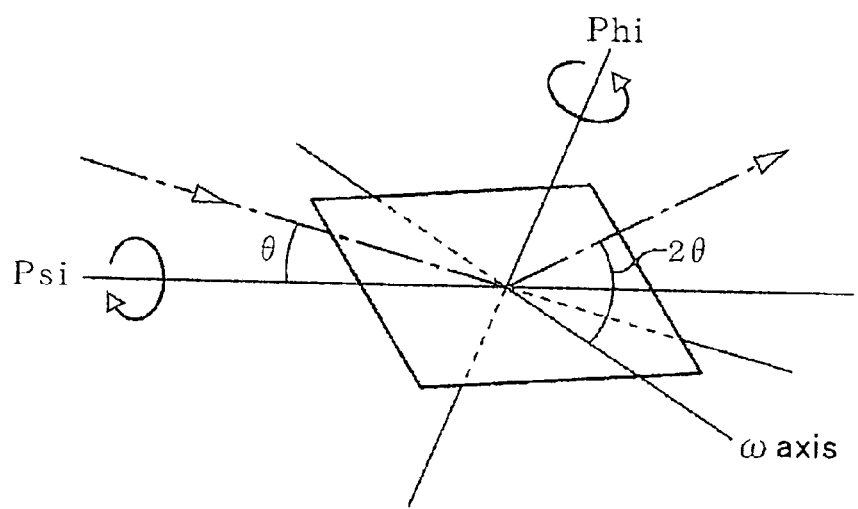
FIG. 3 is an explanatory view showing a relation between a lattice plane and incidence of the X-rays in the measurement of the intensity of X-rays.

A pole figure is a view displaying what kind of texture the lattice plane has among samples, and displays a plot showing with how much intensity the azimuth in question (referred to as a pole) distributes in a pole stereo projection. In short, by checking a pole figure, information about how the lattice plane in question orients to a sample surface, can be obtained, In the pole figure measurement, as shown in FIG. 3, X-ray intensity is measured with keeping 2 θ axis at a specific diffraction angle and rotating around two axes independently, which are orthogonal to the ω axis, one is a Psi axis being in the in-plane of the substrate and being orthogonal to the ω axis; and the other is a Phi axis passing through the substrate center and parallel to the surface normal. In the pole stereo projection, the radial direction is Psi, and the circumferential direction is Phi.

Figure 4:
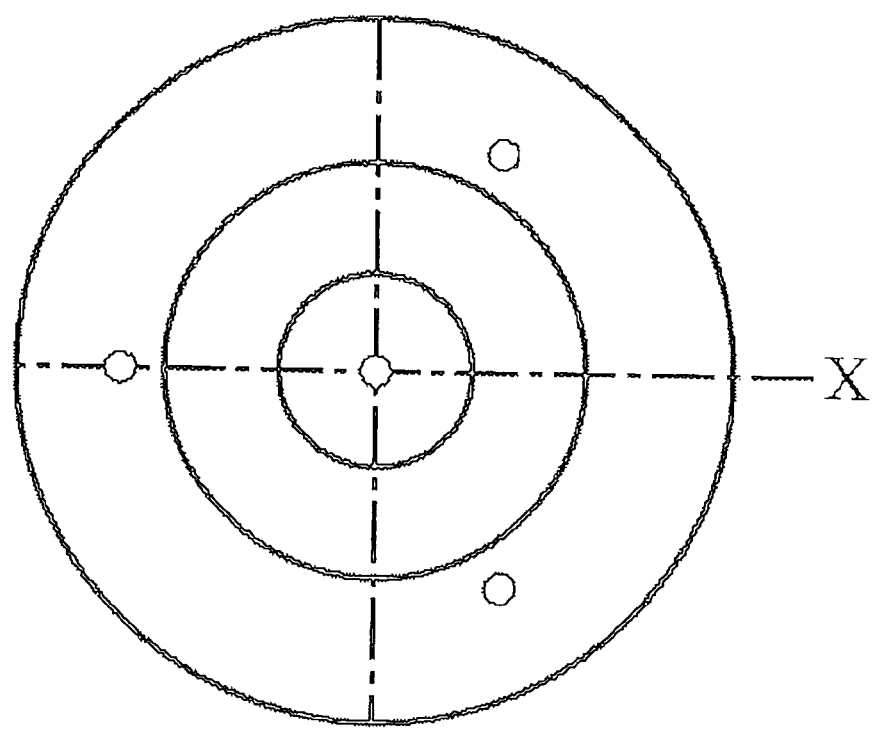
FIG. 4 is a (111) pole figure of a single crystal film in which the (111) plane grows in parallel to the substrate surface.

A single crystal aluminum (Al) of which (111) plane grows in parallel to the substrate surface is taken as an example. Using a CuKα for X-ray source, 2 θ is fixed to a diffraction angle at 38.5° for the aluminum (111) diffraction angle, the Psi axis and the Phi axis are scanned, and the intensity is plotted on the pole stereo projection. Then, a pole figure shown in FIG. 4 is obtained. In other words, since the angle between {111} planes is 70.5°, one (111) pole appears in the center and three (111) poles appear on a circumference of Psi=70.5° at intervals of 120°. If it is a (111) twin crystal, it gives a pattern in FIG. 4, and a pattern in FIG. 5 which is obtained by superimposing a pattern obtained by rotating FIG. 4 by 180°. In short, while in the case of aluminum (111) single crystal, it gives a three fold symmetry pattern, in the case of aluminum (111) twin crystal structure, it gives a six times symmetry pattern. Note that when the specific direction of the substrate is taken to be Phi=0°, the azimuth relation between the substrate and the aluminum film can be obtained.

Figure 5:
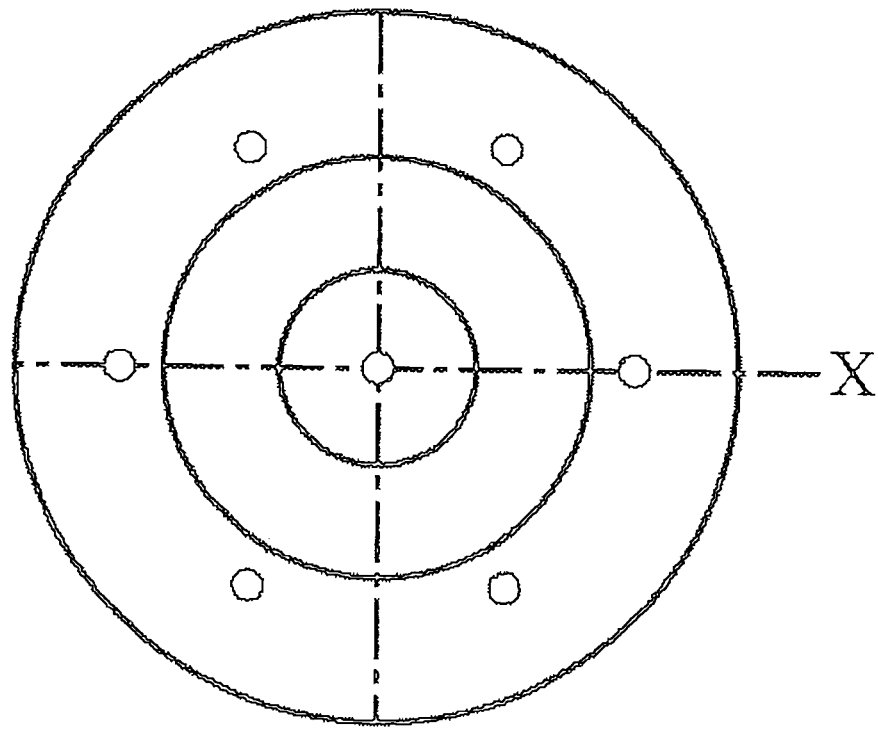
FIG. 5 is a (111) pole figure of a twin crystal film in which the (111) plane grows in parallel to the substrate surface.
Figure 6:
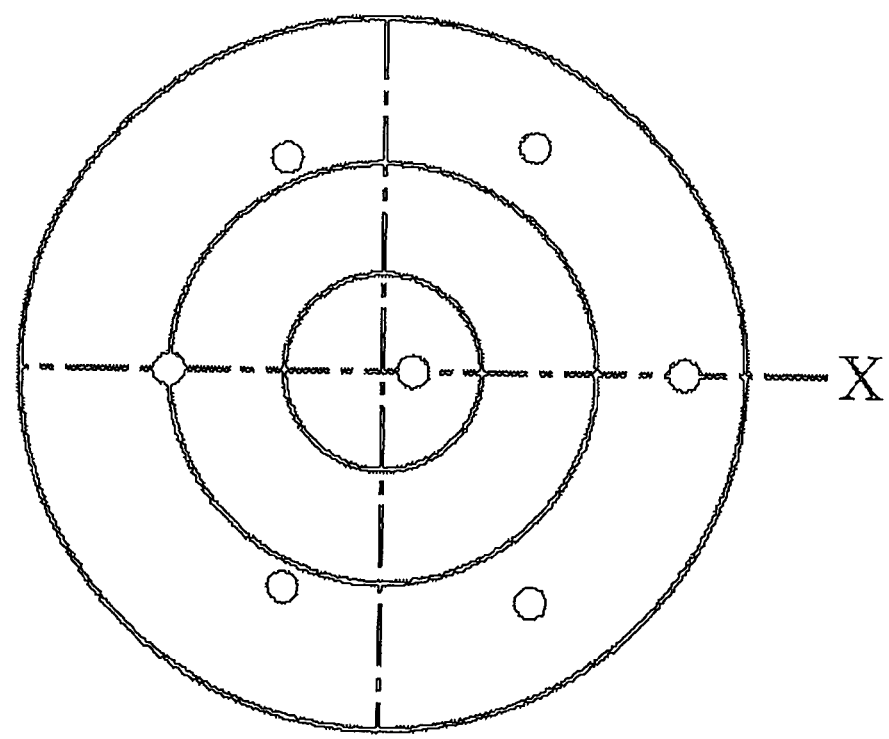
FIG. 6 is a (111) pole figure of a (111) twin crystal film grown inclinedly with respect to the substrate surface.

A (111) pole figure for a twin crystal structure, of which (111) plane tilts from the substrate surface, is shown in FIG. 6, in which the (111) pole existing in the center of FIG. 5 shifts the Psi by the tilt angle. FIG. 6 is a pole figure showing Psi tilted by 10°. As described in non-Patent Document 1, since an aluminum film on a 64 degree Y-cut LiNbO$_3$ substrate grows aluminum (111) plane in a twin crystal on a LiNbO$_3$ plane tilted from the substrate surface by 26°, the (111) pole figure in this case is just like a pattern in FIG. 6, the center of which is Psi=26°.

Figure 7:
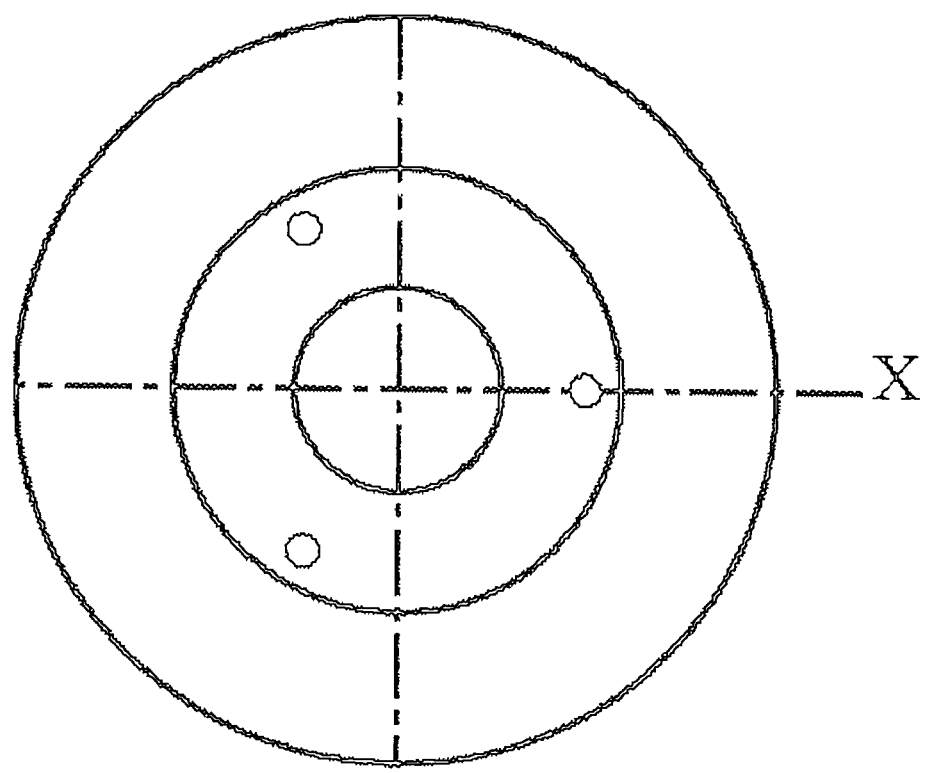
FIG. 7 is a (100) pole figure of a single crystal film in which a (111) plane grows in parallel to the substrate surface.

In the above example, what will happen to (111) pole figure, is explained, and it is possible to consider the (100) pole figure similarly. In a single crystal aluminum, the (111) plane of which grows parallel to the substrate surface, since the angle between the {111} plane and the {100} plane is 54.7°, when 2 θ is fixed to the diffraction angle 44.8° of the aluminum (200) plane, Psi and Phi axes are scanned, and intensity is plotted on the pole stereo projection, a pattern is obtained, in which three (100) poles appear at intervals of 120° on the circumference of Psi=54.7° as shown in FIG. 7. As is clear when FIG. 4 and FIG. 7 are compared with each other, the manner of appearing three spots excluding the center spot has a specific characteristic of 60° phase shift. The pole figures of (111) twin crystal and (100) twin crystal which grows in a tilted direction can be plotted in the same manner.

When analyzing a texture structure, it is desirable to perform pole figure measurement on a plurality of poles to confirm no contradiction between the mutual pole figures. When discussing a (111) texture structure, it is convenient for easy interpretation to use the (111) pole figure. If the (100) pole figure is used for expressing "a (111) twin structure having a plurality of centers of symmetry" as shown in Patent Document 23, it may make an error in interpretation because it is not known where the center of symmetry (111) poles are.

Embodiment 1

A 40 degree Y-cut LiTaO$_3$ substrate was immersed in an organic solvent, such as isopropyl alcohol (IPA), and ultrasonic cleaning was carried out by applying ultrasonic into the solution. Then, the substrate was put into a DC magnetron sputtering apparatus. After vacuum exhausting to $5 \times 10^{-8}$ Torr, a high purity argon (Ar) gas was introduced into the apparatus via a mass flow controller, and 10 nm of titanium (Ti), and 200 nm of aluminum (Al) were deposited in sequence. For any targets, deposition was conducted under conditions of argon pressure 7 mTorr, and DC 0.5 A. Note that the substrate temperature was kept at room temperature.

Both (111) and (200) pole figures of this aluminum film were measured using a 4-axis X-ray diffractometer with CuKα as an X-ray source. Diffraction angles of 111 reflection and 200 reflection (2 θ) are 38.5° and 44.8° respectively. The sample was set to an X-ray diffractometer (goniometer stage) so that the X-axis of a 40 degree Y-cut LiTaO$_3$ substrate coincides with Phi=0.

Figure 8:
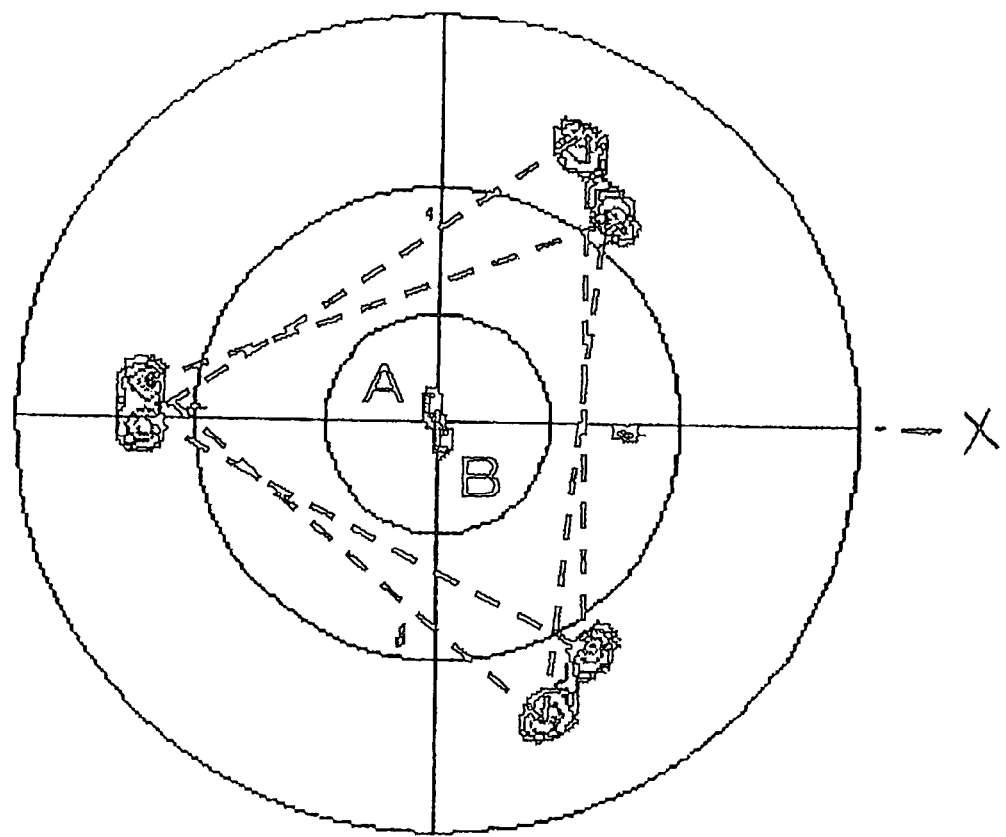
FIG. 8 is an aluminum (111) pole figure (actual measurement view) of 40 degree Y-cut LiTaO$_3$ substrate/titanium (Ti) (10 nm thick)/aluminum (Al) (200 nm thick)
Figure 9:
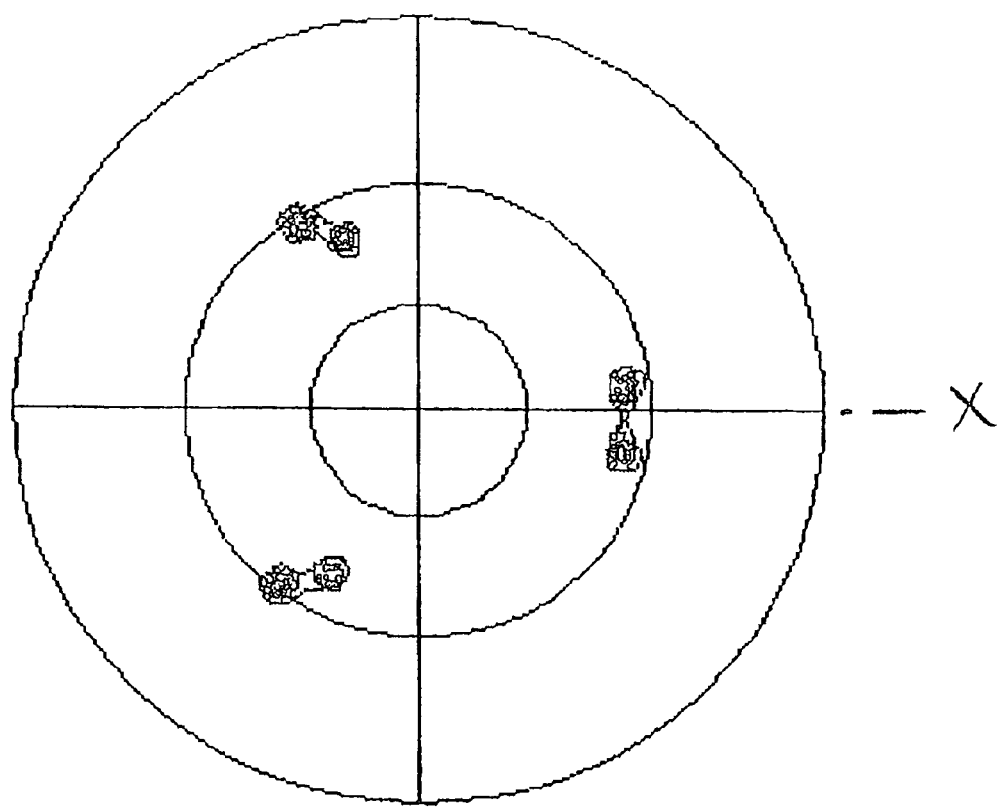
FIG. 9 is an aluminum (200) pole figure (actual measurement view) of 40 degree Y-cut LiTaO$_3$ substrate/titanium (Ti) (10 nm thick)/aluminum (Al) (200 nm thick)
Figure 10:
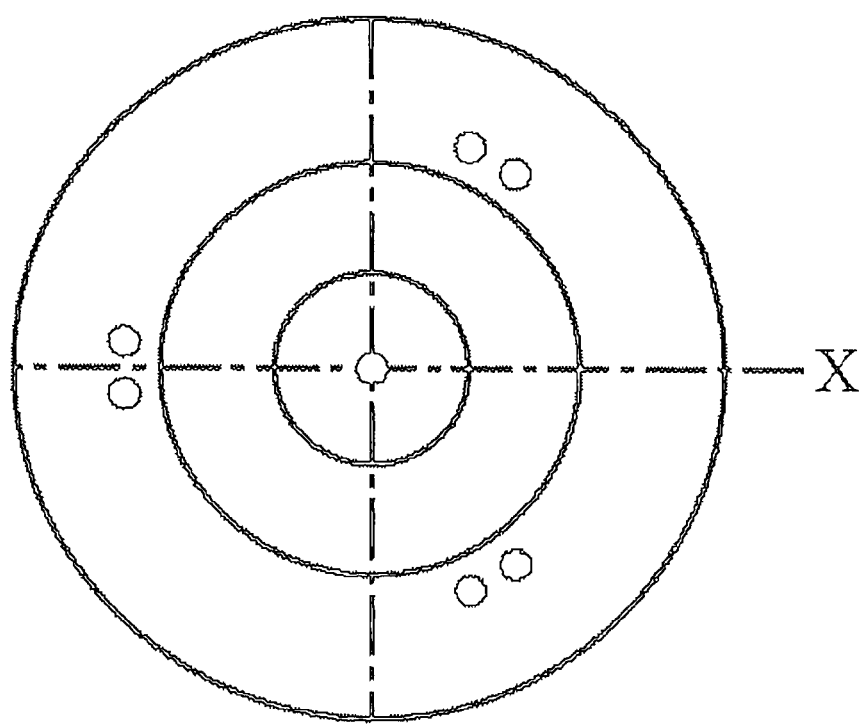
FIG. 10 is a view displaying a relative relation in the (111) in-plane of two domains by shifting the two (111) domain center spots to the center of the pole stereo projection in the aluminum (111) pole figure in FIG. 7.

The (111) pole figure and the (100) pole figure are shown in FIG. 8 and FIG. 9, respectively. Looking the (111) pole figure first, two strong spots (referred to as A and B respectively) are observed in the center. Two triangle patterns around these two spots which are shown by a dotted line in the figure, are noticed. It should be noted that sharp spots other than these two spots in FIG. 8 are neglected because they come from a lithium tantalate substrate. When coordinate shifting of the triangle pattern around A and the triangle pattern around B are conducted in a manner that A and B come to the center of the pole stereo projection, 6 spots are arranged on the circumference of Psi=70°. Spots belonging to A, or spots belonging to B are converted to a pattern in which these spots are arranged 120° apart. Therefore, it is found that there exist two single crystal domains of a (111) single crystal domain around A and a (111) single crystal domain around B. In short, a pseudo-single crystal film composed of two (111) domains is obtained. When the centers of two (111) domains are matched as in FIG. 10, it is found that a displacement angle within both planes is 10 degrees.

The matching relation between the respective (111) domains and a LiTaO$_3$ substrate is further analyzed from the pole figure in FIG. 8. Since two spots A and B are on the circumference of Psi=3°, it is found that the (111) lattice planes of two (111) single crystal domains are almost parallel or tilt by several degrees to a LiTaO$_3$ substrate surface. Furthermore, since the X-axis of 40 degree Y-cut LiTaO$_3$ substrate matches with Phi=0°, the <–1-12> direction of the respective (111) domains are almost parallel to the X-axis direction of LiTaO$_3$, or two (111) domains can be said to be arranged nearly in a mirror symmetry to the X-axis. As described above, two (111) domains are about 10 degree apart within the plane in this case.

A structure analyzed using the (111) pole figure in FIG. 8 can be explained in the (100) pole figure in FIG. 9 with no contradiction at all. However, since there is no pole serving as a center like that in FIG. 8, in the (100) pole figure in FIG. 9, it is troublesome and difficult to estimate precisely the domain structure only from the (100) pole figure, especially to estimate precisely a tilt angle of the domain <111> axis from the substrate surface, or a displacement angle in the in-plane between two domains. Therefore, the (111) pole figure will be used for all embodiments below.

Embodiment 2

As a second embodiment, growth on a 40 degree Y-cut LiTaO$_3$ substrate will be explained. In the present embodiment, a titanium (Ti)/aluminum (Al)—0.5 wt % copper (Cu) laminated film was deposited using an ion beam sputtering apparatus. Similarly to embodiment 1, a 36 degree Y-cut lithium tantalate substrate was introduced in the ion beam sputtering apparatus after ultrasonic cleaning with isopropyl alcohol (IPA). Argon ions extracted from a Kaufmann type ion source were irradiated to a target, and the target material sputtered from there was deposited on the substrate. A titanium was deposited under conditions of beam voltage 1000 V, and beam current 30 mA, and aluminum (Al)—0.5 wt % copper (Cu) was deposited under conditions of beam voltage 1200 V, and beam current 50 mA. The respective film thickness were 5 nm and 200 nm. Argon pressure was $2\times10^{-4}$ Torr. The substrate temperature was room temperature.

Figure 11:
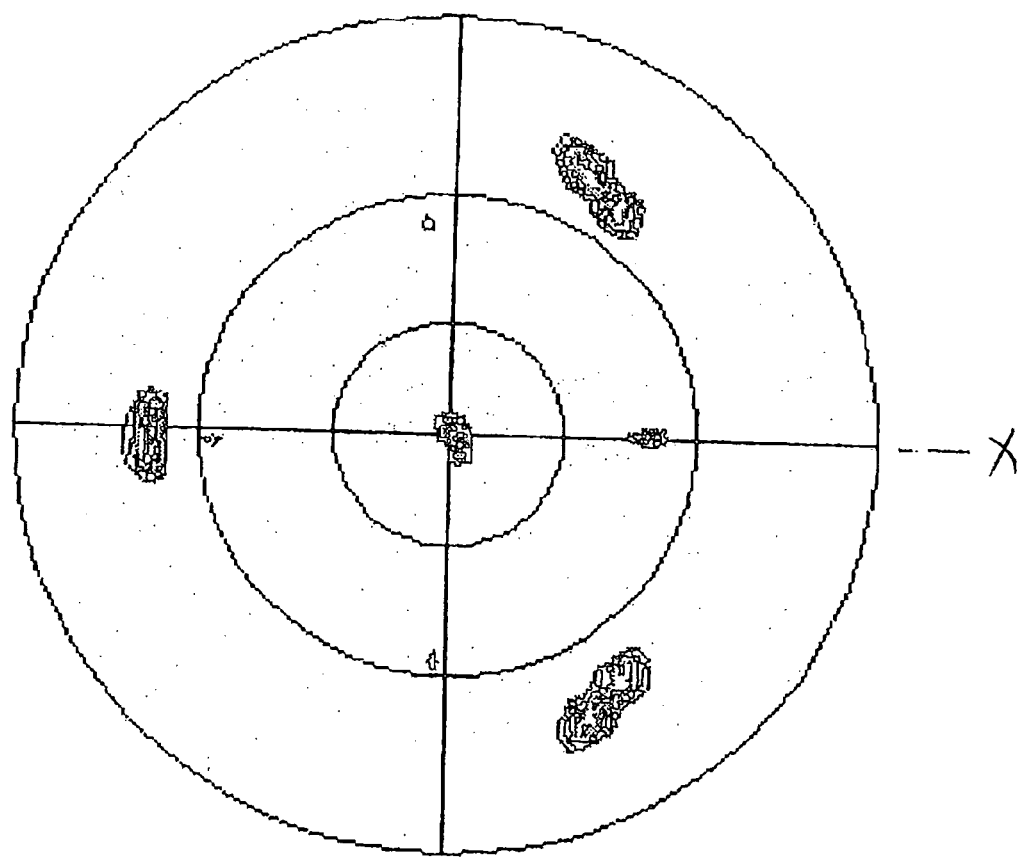
FIG. 11 is an aluminum (111) pole figure (actual measurement view) of 40 degree Y-cut LiTaO$_3$ substrate/titanium (Ti) (5 nm thick)/aluminum (Al) (200 nm thick)

An aluminum pole figure will be shown in FIG. 11. That it is a pseudo-single crystal film composed of two (111) domains is basically the same as embodiment 1, except that the displacement angle in the in-plane between two domains are considerably close of about 5 degrees.

The displacement angle in the in-plane between two (111) domains was smaller on the 36 degree Y-cut lithium tantalate substrate. The displacement angle in the in-plane between two (111) domains in titanium (Ti) 5 nm/aluminum (Al)—0.5 wt % copper (200 nm) (Cu) was 1 to 3 degrees.

Embodiment 3

As a third embodiment, growth on a 50 degree Y-cut $LiTaO_3$ substrate will be explained. A titanium (Ti)/aluminum (Al)—0.5 wt % copper (Cu)—3.5 wt % magnesium (Mg) laminated film was deposited using an ion beam sputtering apparatus under the same conditions as those in Embodiment 2. The thickness of titanium (Ti), aluminum (Al)—0.5 wt % copper (Cu)—3.5 wt % magnesium (Mg) are 10 nm and 200 nm respectively.

Figure 12:
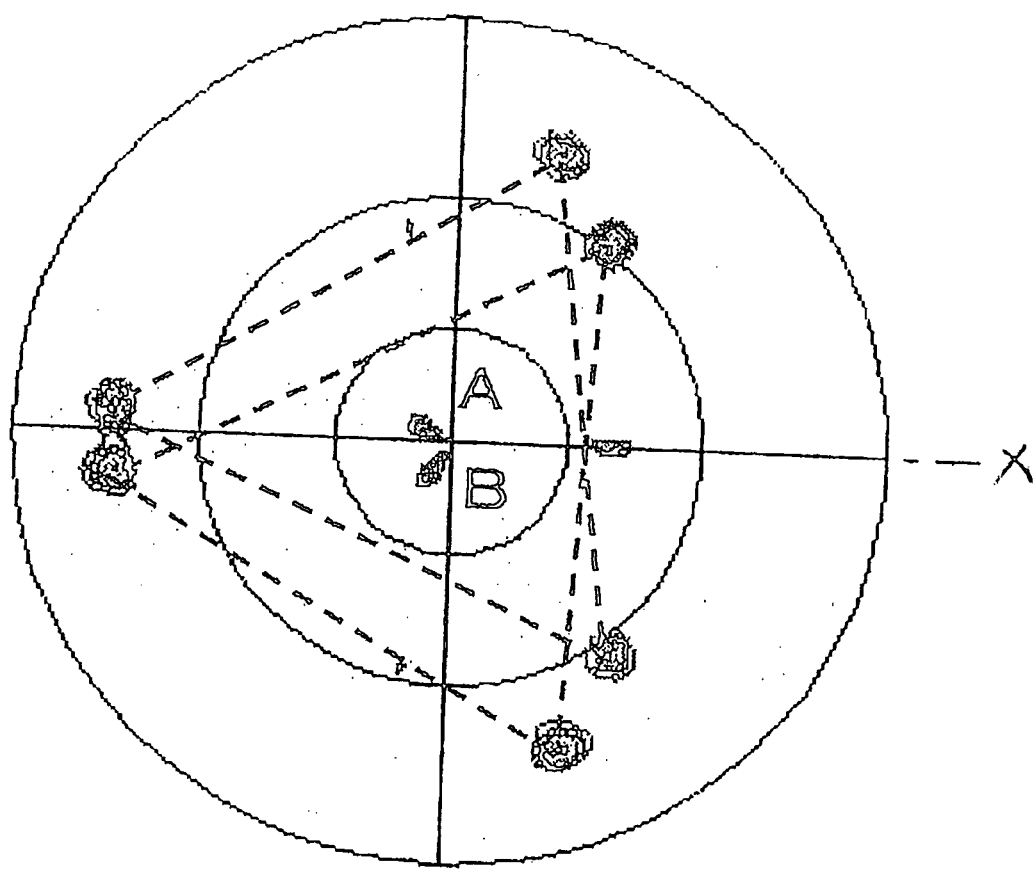
FIG. 12 is an aluminum (111) pole figure (actual measurement view) of 50 degree Y-cut LiTaO$_3$ substrate/titanium (Ti) (10 nm thick)/aluminum (Al) (200 nm thick)

An aluminum (111) pole figure is shown in FIG. 12. Assuming that the spots serving as the centers of two (111) domains are A and B, as for the matching relation in the direction vertical to the plane, the <111> axis vertical to the (111) plane is tilted 6 degrees or 9 degrees to the lithium tantalate substrate surface, because the respective coordinates are (Phi, Psi)=(157°, 6°) and (239°, 9°). Meanwhile, since the X-axis of the lithium tantalate substrate matches with Phi=0° in the in-plane matching relation, the <-1-12> direction of the respective (111) domains are almost parallel to the X-axis direction of lithium tantalate. In other words, it can be said that two (111) domains are arranged so as to be almost in mirror symmetry to the X-axis. In this case, two (111) domains are about 15° apart in the in-plane.

Comparison Example

Figure 13:
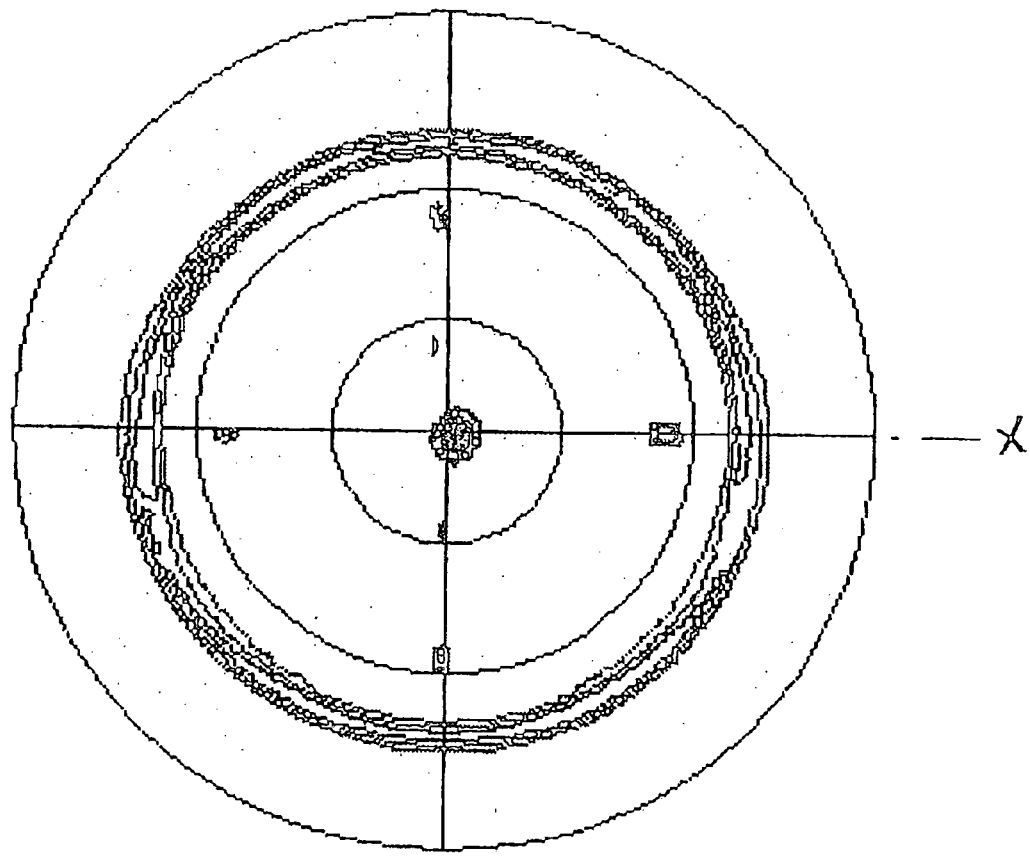
FIG. 13 is an aluminum (111) pole figure (actual measurement view) of 36 degree Y-cut LiTaO$_3$ substrate/titanium (Ti) (1 nm thick)/aluminum (Al) (200 nm thick)
Figure 14:
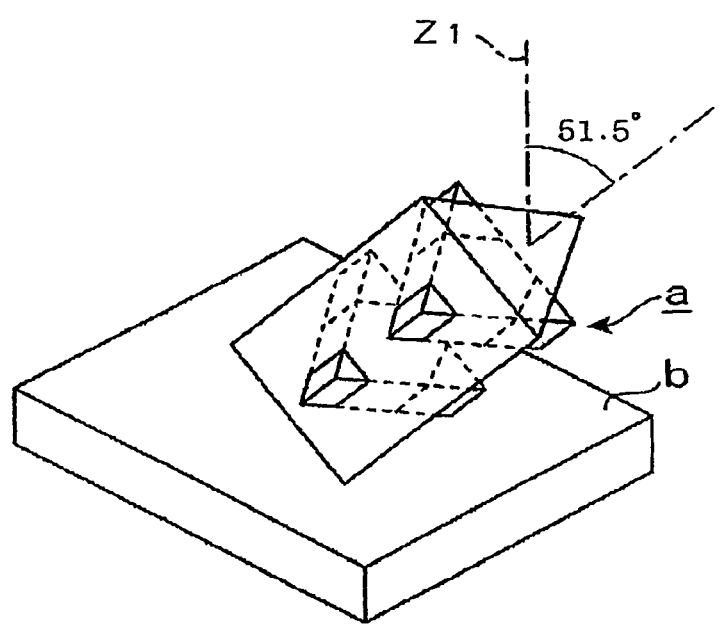
FIG. 14 is a perspective view of a domain (111)a of an aluminum film grown in a direction deviated by 51.5° from a normal Z1 to a piezoelectric substrate b.

An aluminum (111) pole figure of a titanium (1 nm)/aluminum (200 nm) laminated film on a 36 degree Y-cut $LiTaO_3$ substrate is shown in FIG. 13. The sample is deposited with the same sputtering apparatus and under the same conditions of deposition as in Embodiment 1. The pole figure measured as in FIG. 13 is composed of a spot at the center and ring patterns having nearly uniform intensity on the circumference of Psi=70°, and shows that it is a uniaxial high texture film. Note that the spots other than the central spot and the rings are diffraction from the $LiTaO_3$ substrate.

When the thickness of the titanium buffer film is thinner than 5 nm, a pseudo-single crystal composed of two (111) domains can not grow with good reproducivility. When the thickness of the titanium film was extremely thin or there was no existence of a titanium film, aluminum did not grow in a high texture structure, and became a film having a so-called poly crystal structure. As a result of studying the effect of the thickness of a titanium film by changing a cut angle of the substrate, it is found that if the thickness of the titanium buffer film is 5 nm or more, the pseudo-single crystal film composed of two (111) domains can grow with good reproducibility and without being affected largely by the cut angle, as shown in Embodiments 1 to 3.

Embodiment 4

The electrode films prepared in Embodiments 1 to 3, and Comparison Example, are subjected to photolithography and dry etching, and a ladder type surface acoustic wave filter designed for 800 MHz band was prepared. An evaluation test for power durability of the prepared surface acoustic wave filter was carried out. The evaluation test was carried out in accordance with the evaluation system, and the test conditions described in Patent Documents 20 or 21. As a result, the life of the pseudo-single crystal aluminum electrode composed of two (111) domains in Embodiments 1 to 3 according to the present invention is 5000 times or more than that of the uniaxial high texture electrode in Comparison Example, which shows remarkable improvement of power durability of the electrode film of the present invention.

Although a 36 to 50 degree Y-cut $LiTaO_3$ substrate is used as a piezoelectric substrate in the embodiments explained as above, it is possible to grow a pseudo-single crystal aluminum film composed of two (111) single crystal domains with good reproducivility even on a $LiNbO_3$ substrate of which lattice constant is nearly equal.

What is claimed is:

1. A surface acoustic wave device, comprising:
   a single crystal piezoelectric substrate composed of lithium tantalate ($LiTaO_3$) or lithium niobate ($LiNbO_3$); and
   an electrode formed on the piezoelectric substrate,
   wherein the electrode comprises a first film formed of titanium (Ti), and a second film formed of aluminum or aluminum alloy made by adding a small amount of metal atom to aluminum (Al),
   wherein the second film is formed of a crystal film including two (111) domains growing in different directions from each other,
   wherein both <111> directions of the two (111) domains tilt at angles within 0 to 10 degrees to the surface of the piezoelectric substrate, and
   wherein <11-2> directions in an in-plane of each of the (111) domains are arranged uniformly, while the <11-2> direction in the in-plane of one (111) domain and the <11-2> direction in the in-plane of the other (111) domain are 1 to 15 degrees apart from each other.

2. The surface acoustic wave device according to claim 1, wherein the <11-2> direction of at least one (111) domain out of said two (111) domains is almost parallel to the X-axis direction in the in-plane of said piezoelectric substrate.

3. The surface acoustic wave device according to claim 1, wherein said two (111) domains are arranged to be nearly in mirror symmetry to the X-axis in the in-plane of the piezoelectric substrate.

4. The surface acoustic wave device according claim 1, wherein said piezoelectric substrate is a 36 to 50 degree rotated Y-cut lithium tantalate substrate.

5. The surface acoustic wave device according claim 1, wherein the thickness of said film formed of titanium is 5 nm to 20 nm.

6. The surface acoustic wave device according to claim 1, wherein said first film is disposed on a surface of the substrate and said second film is disposed on the first film.

7. A method of manufacturing a surface acoustic wave device which comprises a single crystal piezoelectric substrate composed of lithium tantalate ($LiTaO_3$) or lithium niobate ($LiNbO_3$), comprising:

cleaning a surface of the piezoelectric substrate;
forming an electrode on the surface of the piezoelectric substrate following said cleaning, including:
  forming a first film formed of titanium (Ti) on the surface of the piezoelectric substrate, and
  forming, on said first film, a second film formed of aluminum or aluminum alloy made by adding a small amount of metal atom to aluminum (Al) arranged to form said electrode,
    wherein said second film is formed of a crystal film including two (111) domains growing in different directions from each other,
    wherein both <111> directions of the two (111) domains tilt at angles within 0 to 10 degrees to the surface of the piezoelectric substrate, and
    wherein <11-2> directions in an in-plane of each of the (111) domains are arranged uniformly, while the <11-2> direction in the in-plane of one (111) domain and the <11-2> direction in the in-plane of the other (111) domain are 1 to 15 degrees apart from each other,
wherein the cleaning process cleans the surface of the piezoelectric substrate by applying ultrasonic waves to organic solvent in a state that the organic solvent is in contact with the surface of the piezoelectric substrate, without performing wet etching.

8. The method of manufacturing the surface acoustic wave device according to claim 7, wherein said forming the second film includes arranging the <11-2> direction of at least one (111) domain out of said two (111) domains almost parallel to the X-axis direction in said piezoelectric substrate surface.

9. The method of manufacturing the surface acoustic wave device according to claim 7, wherein said forming the second film includes arranging said two (111) domains nearly in mirror symmetry to the X-axis in the piezoelectric substrate surface.

* * * * *